United States Patent [19]
Bernardoni et al.

[11] Patent Number: 5,172,303
[45] Date of Patent: Dec. 15, 1992

[54] ELECTRONIC COMPONENT ASSEMBLY

[75] Inventors: Lonnie L. Bernardoni; James A. Zollo, both of Coral Springs; Kenneth R. Thompson, Sunrise, all of Fla.

[73] Assignee: Motorola, Inc., Schaumburg, Ill.

[21] Appl. No.: 617,323

[22] Filed: Nov. 23, 1990

[51] Int. Cl.⁵ .................................................. H05K 7/00
[52] U.S. Cl. ............................... 361/396; 174/52.4; 361/393; 361/414; 257/686; 257/693
[58] Field of Search ............... 361/392, 393, 394, 395, 361/396, 414, 417, 419, 420; 174/52.4; 357/75, 71, 72, 74

[56] References Cited

U.S. PATENT DOCUMENTS

| | | | |
|---|---|---|---|
| 3,379,937 | 4/1968 | Shepherd | 174/260 X |
| 4,288,841 | 9/1981 | Gogal | |
| 4,437,718 | 3/1984 | Selinko | |
| 4,617,730 | 10/1986 | Geldermans et al. | 174/52.4 X |
| 4,654,694 | 3/1987 | Val | 174/52.4 X |
| 4,691,225 | 9/1987 | Murakami et al. | 174/52.4 X |
| 4,940,181 | 7/1990 | Juskey, Jr. et al. | 361/406 X |
| 4,969,827 | 11/1990 | Hahs, Jr. | 361/395 X |
| 5,016,138 | 5/1991 | Woodman | 361/381 |

FOREIGN PATENT DOCUMENTS 61-10167 5/1986 Japan ......................... 357/75

*Primary Examiner*—Leo P. Picard
*Assistant Examiner*—D. Sparks
*Attorney, Agent, or Firm*—Pedro P. Hernandez

[57] ABSTRACT

A stackable surface mount electronic component assembly 100 allowing for the stacking of electronic components 108, and 112 is disclosed. The stackable surface mount electronic component assembly 100 includes electronic component carriers 102, and 114, each having an electronic component 108, and 112 respectively. The two carriers 102, and 114, are electrically interconnected by the use of solder balls 106. Electronic component carrier 114 is in turn attached to an external printed circuit board by the use of solder balls 110. Optionally, each of the electronic components 108, 112 can be encapsulated using encapsulation material prior to the joining of the two carriers 102, and 114. In an alternate embodiment recesses 302 are located on top of the elevated peripheral edge 116 allowing for the proper alignment of the two carriers 102, and 114.

4 Claims, 3 Drawing Sheets

ELECTRONIC COMPONENT ASSEMBLY

TECHNICAL FIELD

This invention relates generally to electronic component carriers, and more specifically to stackable surface mount electronic component carriers.

BACKGROUND

Electronic component carriers or chip carriers, as they are more commonly known, find use in numerous electronic device applications. Chip carriers protect the electronic components, or integrated circuit (IC) dies, from the external environment which might damage them. For example, carriers protect the electronic components from dust, humidity, and other damaging environmental factors. The carriers also further protect the delicate IC die during the manufacturing and testing processes.

As electronic devices such as communication devices, have become more complex, the need to minimize the board space used in implementing a design has become more critical. The challenge to the product design engineer has been to increase the number of components within the limited space of the printed circuit board. This need to maximize the use of all available space in a design has led to more creative packaging solutions in order to yield greater component densities.

Standard approaches of stacking electronic packages in order to achieve greater use of all available space in a design has led to more complex and larger packages in order to facilitate and protect the increased interconnections. This in turn has resulted in larger packages which can normally be tested only after they have been fully assembled into a stacked assembly resulting in increased manufacturing costs.

As a result, a need exists in the art for a stacked electronic component carrier which can minimize the overall volumetric size of the package, and still allow for the individual testing of each of the stacked layers before the multiple layers are united. This would minimize the manufacturing costs by isolating defective layers before final assembly of the stacked surface mount electronic component assembly is completed.

SUMMARY OF THE INVENTION

Briefly, according to the invention, a stacked electronic component assembly is disclosed. According to the invention a surface mount electronic component carrier includes a substrate having two major surfaces. One of the major surfaces has an elevated peripheral border surrounding the surface, and further defining a cavity area. The surface surrounded by the elevated border has conductive pads allowing for the mounting of an electronic component within the cavity area. A metallized pattern including conductive pads selectively interconnects both major surfaces, and the top of the elevated peripheral border which also has conductive pads.

In another aspect of the invention, a stacked electronic component assembly includes two surface mount electronic component carriers electrically connected to each other. The first electronic component carrier being electrically connected to the contact pads on the top surface of the elevated peripheral border found on the second surface mount electronic component carrier.

In still another aspect of the present invention the top surface of the peripheral border of one of the surface mount electronic component carriers has recesses which allow a second surface mount electronic component carrier to be properly aligned to the first electronic component carrier prior to connecting the two surface mount electronic component carriers together.

BRIEF DESCRIPTION OF THE DRAWINGS

FIG. 2b is a bottom view of FIG. 2a.

DETAILED DESCRIPTION OF THE PREFERRED EMBODIMENT

Figure 1:
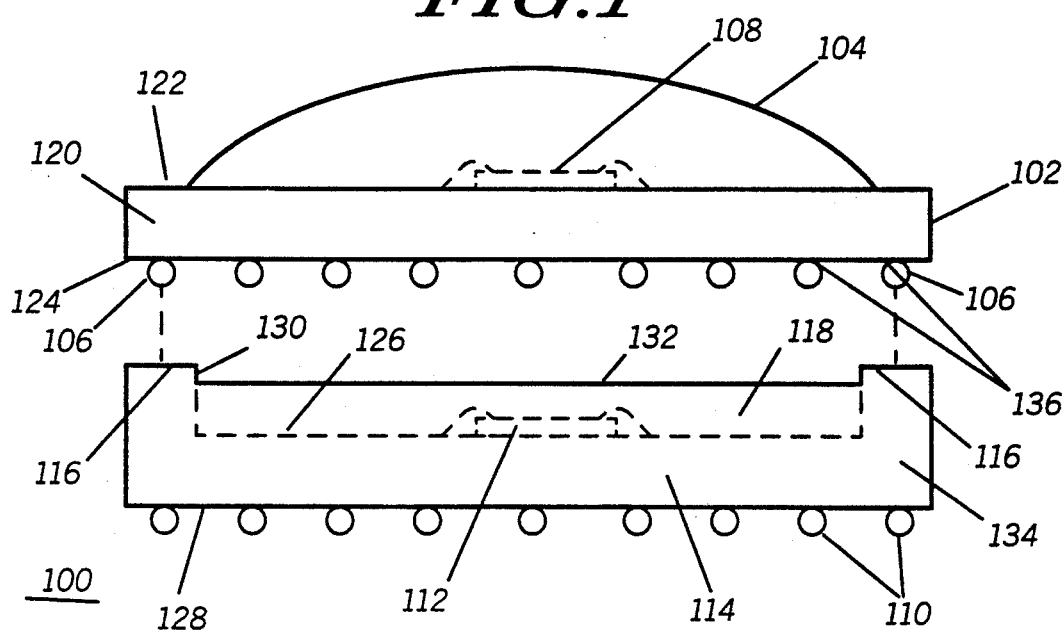
FIG. 1 shows an exploded side view of an electronic component assembly in accordance with the present invention.

Referring to FIG. 1, an exploded side view of a stackable surface mount electronic component assembly 100 embodying the present invention is shown. The assembly 100 includes a first surface mount electronic component carrier 102 which is formed from a substrate 120 preferably formed of insulating material such as glass epoxy, ceramic, standard pc board material such as FR4 (a glass epoxy mixture), or other suitable materials. The substrate can have multiple layers as known in the art. The substrate 120 has two major surfaces, top surface 122, and bottom surface 124. The top surface 122 has conductive pads which allow for the attachment of an electronic component 108 onto carrier 102. The bottom surface 124 has a plurality of conductive pads 136 (not shown) which allow for the attachment of solder balls 106 onto the bottom surface 124. The solder balls 106 are placed onto the conductive pads using a process referred to as controlled collapsible chip carrier connection (C5) a process which is well known in the art. In order to further protect the electronic component 108, the component 108 is preferably encapsulated with encapsulation material 104. The encapsulation material 104 can be any one of many materials used in the art to encapsulate electronic components. The encapsulation material 104 can be applied by, "glob topping" it on, transfer molding it over the component 108, or using any other well known encapsulation techniques. Preferably, the height of the first electronic component carrier including the encapsulation material is 0.050 inches. Solder balls 106 have a height of 0.018 inches, thereby making the overall structure approximately 0.068 inches in height, as shown.

A second surface mount electronic component carrier 114 is also part of assembly 100. Carrier 114 includes a substrate 134 which has two major surfaces, first major surface 126, and second major surface 128. Cavity area 118 is formed by elevated peripheral border 130 which surrounds the border of surface 126. Elevated peripheral border 130 is preferably formed by attaching sequentially laminated layered rings of pc board material, each layer having an aperture which defines the cavity area 118. Another method of forming the elevated boarder can include molding the electronic carrier 114 out of plastic or other similar materials. The top surface 116 of the elevated border 130 allows for the attachment of another surface mount carrier since conductive pads are found on top surface 116.

First major surface 126 has a conductive pattern (shown in FIG. 2a) for receiving the electronic component 112 within the cavity area 118, the component 112 is attached by the use of standard soldering techniques, or other well known component attachment methods. Once the component 112 is attached, the cavity area 118 is preferably filled with encapsulation material 132, thereby protecting the component 112 from environmental factors such as dust, and humidity. The second major surface 128 also has a plurality of solder balls 110 attached to contact pads (pads 210 shown in FIG. 2b) which are located on surface 128. Electronic component carrier 114 is preferably 0.040 inches in height including the encapsulation material 132. Since the encapsulation material 132 is found inside the cavity area 118 it adds no additional height to the second carrier 114.

Figure 2A:
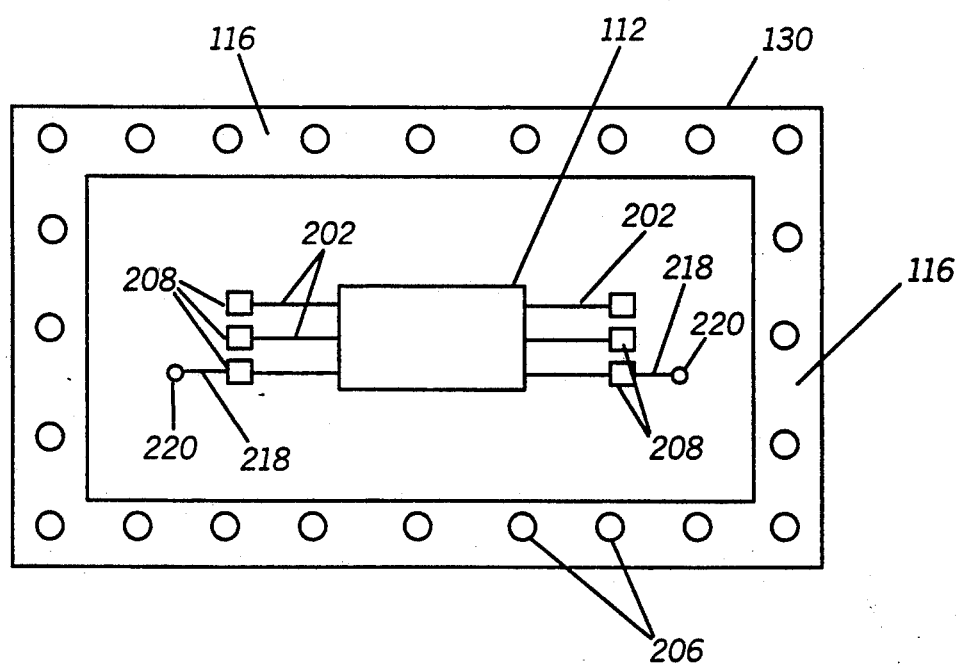
FIG. 2a is a top view of the bottom electronic carrier shown in FIG. 1, in accordance with the present invention.

FIG. 2a shows a top view of surface mount electronic component carrier 114. The elevated peripheral border 130 forms a cavity area 118 with surface 126 having conductive pads 208 which allow for the mounting of an electronic component 112. Electrical runners 218 allow for the electrical interconnection between conductive pads 208 and other areas on carrier 114. Some of the runners 218 are connected to metallized vias 220 which allow for the connections to pass through the different layers of carrier 114. The top surface 116 of elevated peripheral border 130 has a plurality of contact pads 206 which are part of a metallization pattern found in surface mount electronic carrier 114 which allows for the routing of electrical signals throughout the carrier 114. The contact pads 206 are selectively interconnected to other contacts pads found in carrier 114 such as contact pads 208 in surface 126, or contact pads 210 (shown in FIG. 2b) found in surface 128. Metallized vias 220 which are embedded through the multiple layers of carrier 114 allow for electrical interconnection connection between the three major surfaces (126, 128, and top surface 116) of carrier 114.

Figure 2B:
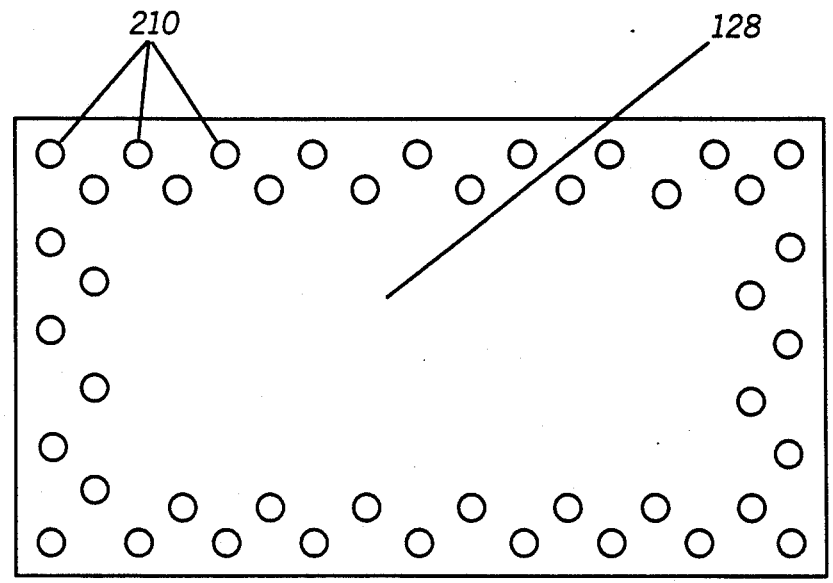

FIG. 2b shows a bottom view of surface mount electronic component carrier 114. Major surface 128 is shown having a plurality of conductive pads 210 (solder balls 110 are not shown), conductive pads have a preferred diameter of 0.024 inches. Conductive pads 210 are connected to an external printed circuit board using solder balls 110 (shown in FIG. 1). Preferably, solder balls 110 are attached to the conductive pads 210 and then the electronic component assembly is surface mounted onto an external printed circuit board by reflowing solder balls 110. The electronic component assembly 100 can be surface mounted onto printed circuit boards, electronic hybrids, and other surfaces which can support surface mountable electronic assemblies.

Figure 2C:
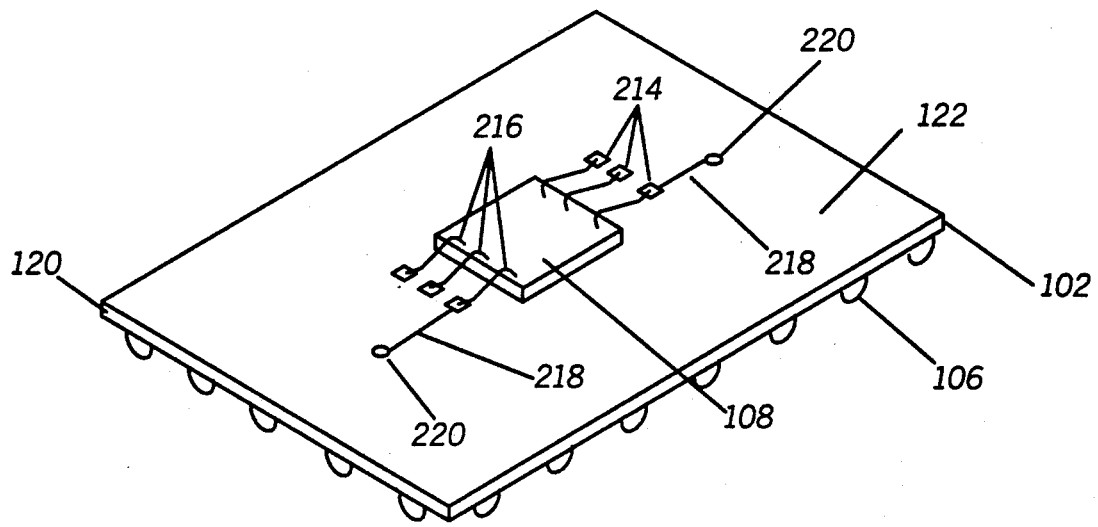
FIG. 2c is a top view of the top electronic carrier shown in FIG. 1, in accordance with the present invention.

In FIG. 2c a top view of electronic component carrier 102 is shown. Electronic component 108 has a plurality of terminals 216 which are shown attached to major surface 122, via conductive pads 214. The electronic component 108 is preferably soldered to conductive pads 214. Some of the conductive pads 214 are connected to electrical runners 218 which are a part of a metallization pattern which allow for the routing of electrical signals throughout carrier 102. In turn some runners 218 are connected to vias 220 in order to transfer the electrical connections to other layers of carrier 102. Also shown are solder balls 106, which allow the electronic component carrier 102 to be attached to electronic component carrier 114. The solder balls 106 can be attached to electronic component carrier 102 by using the C5 process. Electronic component assembly 102 can be tested using conventional testing routines prior to the carrier 102 being united to carrier 114. Since carrier 102 is preferably made out of a thin multi-layer substrate 120 the total height of carrier 102 is minimized as much as possible.

Figure 3A:
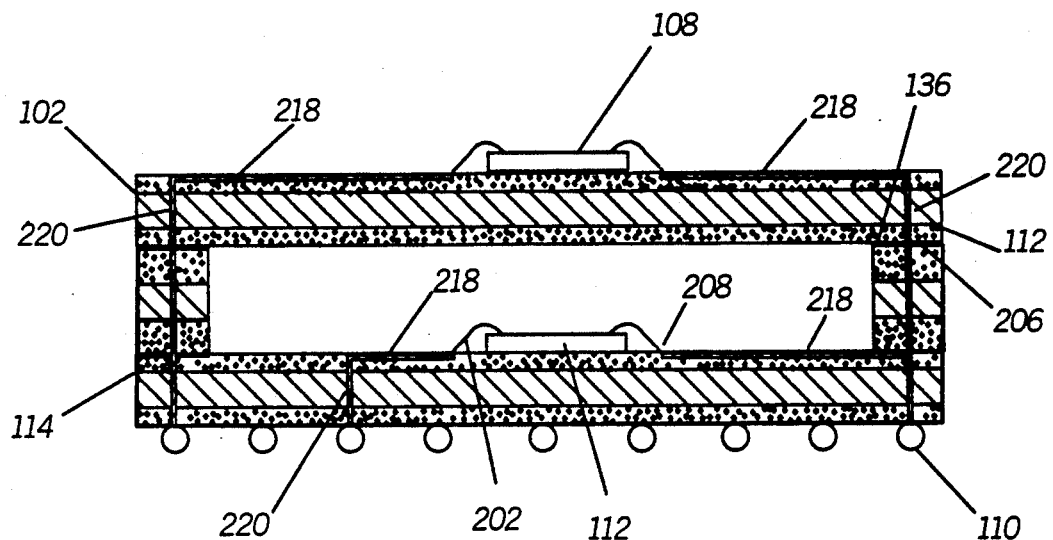
FIG. 3a is a cross-sectional view of an electronic component assembly in accordance with the present invention.

FIG. 3a shows a cross-sectional view of an electronic component assembly 300 in accordance with the present invention. The two electronic component carriers 102, and 114 are shown united to each other. Electrical runners 218 are shown connected to electronic components 108, and 112, allowing for the routing of electrical signals within each layer of the assembly 300. Electrical vias 220 pass the electrical connections through the multiple layers of each of the two carriers 102, and 114. Metallized vias 220 which are embedded through the different layers of each of the carriers 102, and 114, allow for the electrical interconnection between the two major surfaces of each of the carriers 102, and 114, in turn allowing for all the major surfaces of the completed assembly to be interconnected. For example, one of the terminals of component 108 is connected to an electrical runner 218, which in turn passes through to the bottom most surface 128 by way of vias 220. The two carriers 102, 114 are electrically connected between conductive pads 206 found on the top of the elevated border 116 (shown in FIG. 2a), and conductive pads 136 which are found in the bottom of component carrier 102, by solder balls 106 (not shown). The solder balls are reflowed using conventional reflow techniques known in the art thereby uniting the two carriers 102, and 114 as is shown in FIG. 3a. By having electrical conducting vias 220 unite the conductive pads on the different carriers, several carriers can be stacked on top of each other.

The preferred embodiment is shown having two electronic component carriers 102, and 114 stacked one on top of each other, but more than two carriers can be stacked onto each other by having elevated border areas on each of the additional carriers, thereby allowing for a component to be placed between the component carriers.

Figure 3B:
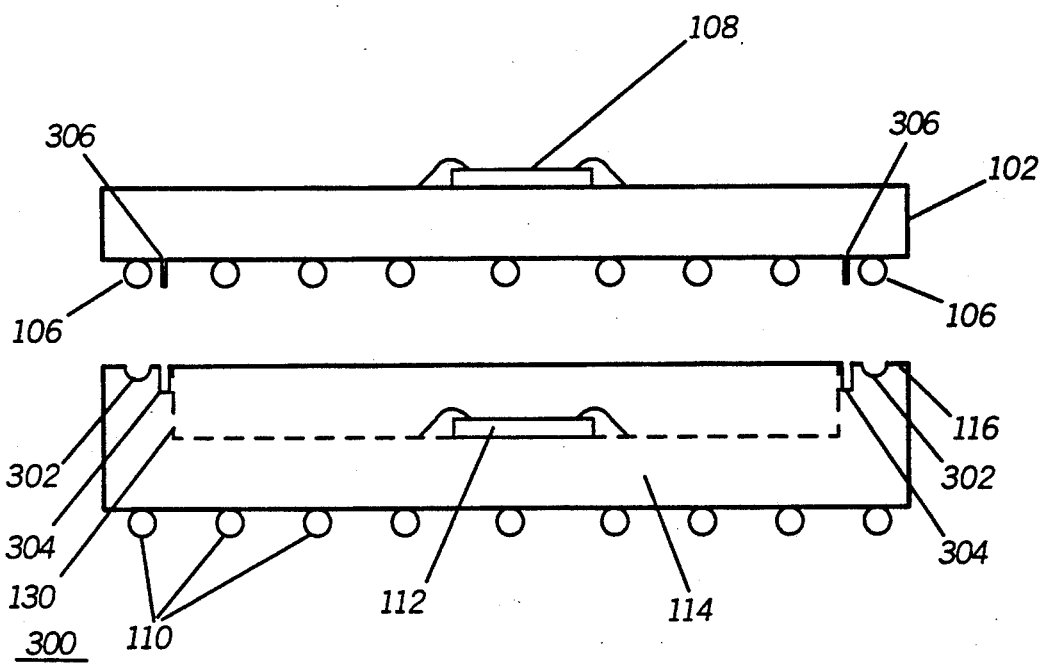
FIG. 3b is an exploded side view of an alternate electronic component assembly in accordance with the present invention.

In FIG. 3b a side view of an alternate electronic component assembly is shown. Included in this assembly are recesses 302 which are located on top surface 116 of elevated peripheral border 130. The recesses 302 allow for the proper alignment of electronic component carrier 102, to electronic component carrier 114, prior to the two carriers being united. Recesses 302 allow some of the solder balls 106 to rest inside of them, thereby aligning the two carriers. The recesses 302 preferably having conductive pads in them which interface to conductive pads 136 from carrier 102, via the solder ball connections. Other methods for the proper mechanical alignment of the two carriers 102, and 114 can include having a mechanical pin 306 on one of the carriers and a positioning aperture 304 on the other carrier, or other similar mechanical alignment arrangements.

By minimizing the height of the elevated border area 130 (which is governed by the height of electronic component 112) the assembly 300 can be designed to have the lowest overall height possible. Each electronic component carrier 102, and 114 though shown with only one electronic component per carrier could support as many components as would be required by the assembly 300, with the size of the assembly 300 growing in size with the addition of additional components.

The electronic component assembly 100 previously discussed provides for reduced overall volumetric size while at the same time making the testing of each individual electronic component carrier easier to accomplish. Since each of the electronic component carriers 102, and 114, are surface mountable, they can be easily tested before uniting into a complete assembly 100. Each of the component carriers can be stacked or mounted directly onto a main printed circuit board. Another major benefit of the present invention is embedded vias 220 which allow for the interconnection of the two carriers through the elevated peripheral border area 130, which has conductive pads 206 on its top surface 116.

The overall small size of the assembly 100 (approximately 0.126 inches in height) allows for it to be placed in reels for automatic machine placement at a later stage, thereby reducing costs in production.

While the present invention has been described in conjunction with specific embodiments, it is evident that many alternatives, and modifications will be apparent to those skilled in the art. Accordingly, it is intended that the present invention embrace all such alternatives, modifications, and variations as fall within the broad scope of the appended claims.

What is claimed is:

1. A stackable surface mount electronic component assembly which will accommodate a plurality of stacked electronic components on to a printed circuit board, comprising:

a first surface mount electronic component carrier including a substrate having first and second major surfaces, and having conductive pads located on both major surfaces with at least some of the conductive pads located in the first major surface allowing for the mounting of an electronic component, and including a metallization pattern for selectively interconnecting the conductive pads; and a second surface mount electronic component carrier including a substrate having a first and second major surface, the first major surface surrounded by an elevated peripheral border having a top surface, the top surface having a plurality of recesses, the elevated peripheral border further defining a cavity area, the electronic component assembly having conductive pads on both major surfaces and in the recesses on top of the elevated peripheral border with at least some of the conductive pads located in the first major surface allowing for the mounting of an electronic component inside of the cavity area, and including a metallization pattern for selectively interconnecting the conductive pads, the first and second surface mount electronic component carriers are electrically connected to each other using controlled collapsible chip carrier connections between the conductive pads in the recesses on top of the elevated peripheral border of the second surface mount electronic component carrier and some of the conductive pads on the first surface mount electronic component carrier, one of said first or second surface mount electronic component carriers further includes at least one positioning pin and the other of said first or second surface mount electronic component carriers has at least one alignment aperture for receiving the at least one positioning pin.

2. A stackable surface mount electronic component assembly in accordance with claim 1, wherein the elevated peripheral border in the second electronic component carrier is formed from sequentially laminated layers.

3. A stackable surface mount electronic component assembly in accordance with claim 1, wherein the second surface mount electronic component carrier includes an electronic component attached to the first major surface and the cavity area in the second surface mount electronic component carrier is encapsulated with encapsulation material substantially covering the electronic component.

4. A stackable surface mount electronic component assembly in accordance with claim 3, wherein the first surface mount electronic component carrier includes an electronic component attached to the first major surface and the electronic component in the first surface mount electronic component carrier is substantially covered with encapsulation material.

* * * * *